United States Patent [19]

Hollingsworth et al.

[11] Patent Number: 4,868,631
[45] Date of Patent: Sep. 19, 1989

[54] BIPOLAR TRANSISTOR WITH SHALLOW JUNCTIONS AND CAPABLE OF HIGH PACKING DENSITY

[75] Inventors: Deems R. Hollingsworth, Missouri City; Steve Thompson, Richmond; Harry F. Pang, Houston, all of Tex.

[73] Assignee: Texas Instruments Incorporated, Dallas, Tex.

[21] Appl. No.: 310,498

[22] Filed: Feb. 13, 1989

Related U.S. Application Data

[63] Continuation of Ser. No. 923,454, Oct. 27, 1986, abandoned, which is a continuation-in-part of Ser. No. 799,042, Nov. 18, 1985, abandoned.

[51] Int. Cl.⁴ .............................................. H01L 27/12
[52] U.S. Cl. ........................................ 357/48; 357/50; 357/55; 357/59
[58] Field of Search ................... 357/48, 50, 55, 59 G

[56] References Cited

U.S. PATENT DOCUMENTS

| | | |
|---|---|---|
| 3,962,779 | 6/1976 | Edwards et al. |
| 3,980,507 | 9/1976 | Curley ............................. 357/59 G |
| 3,982,266 | 9/1976 | Matzer .................................. 357/50 |
| 4,470,062 | 9/1984 | Moromatzu .......................... 357/50 |
| 4,595,944 | 6/1986 | Antipov ................................. 357/50 |
| 4,619,036 | 10/1986 | Haveman .............................. 357/34 |
| 4,680,614 | 7/1987 | Beyer et al. .......................... 357/50 |

Primary Examiner—Martin H. Edlow
Attorney, Agent, or Firm—N. Rhys Merrett; Richard L. Donaldson; Melvin Sharp

[57] ABSTRACT

A method of making a bipolar transistor in an LSI or VLSI process which includes forming a buried DUF collector of a first conductivity type, growing an epitaxial layer of a first conductivity type over said DUF collector and forming isolation means around a transistor region. The transistor region includes a trench which at least partially encloses the transistor region and extends through the DUF collector. Emitter and base regions of the first and second conductivity types, respectively, are formed in the epitaxial layer. A collector contact region of the first conductivity is formed in the epitaxial layer and extends down to the buried DUF collector.

26 Claims, 9 Drawing Sheets

BIPOLAR TRANSISTOR WITH SHALLOW JUNCTIONS AND CAPABLE OF HIGH PACKING DENSITY

RELATED APPLICATIONS

The present application is a continuation of application Ser. No. 923,454 filed Oct. 27, 1986, now abandoned, which is a continuation-in-part of application Ser. No. 799,042 filed Nov. 18, 1985, now abandoned. This application is also related to application Ser. No. 932,752, filed Nov. 19, 1986 which is a continuation-in-part of application Ser. No. 824,388 filed Jan. 30, 1986 (now abandoned).

BACKGROUND

The present invention relates to the fabrication of a bipolar transistor in LSI or VLSI technology featuring shallow junctions for high switching speed and capable of a high packing density.

There has been a great demand for a bipolar transistor capable of a high packing density and high speed switching formed in a VLSI process. One suggested process for achieving these goals is known as a polysilicon self-aligned or PSA. The PSA process, however, incorporates complex etching steps and a double polysilicon sequence which makes the overall flow difficult to manufacture and the obtainable yields low. Another method of obtaining high speed circuits is through sidewall base contact structures. Again complexity of processing, as well as a large number of photolithography levels make the latter structures difficult to manufacture. Other methods utilize a basic bipolar transistor profile with additions such as trench isolation rather than oxide isolation. Such devices have not been able to achieve maximum speed, however.

Accordingly, it is an object of the present invention to provide a bipolar transistor cell formed in a VLSI process which has improved switching speed and is capable of a high packing density.

SUMMARY OF THE INVENTION

According to the present invention there is provided a method of making a bipolar transistor in an LSI or VLSI process which includes forming a buried DUF collector of a first conductivity type, growing an epitaxial layer of a first conductivity type over said DUF collector and forming isolation means around a transistor region. The transistor region includes a trench which at least partially encloses the transistor region and extends through the DUF collector. Emitter and base regions of the first and second conductivity types, respectively, are formed in the epitaxial layer. A collector contact region of the first conductivity type is formed in the epitaxial layer and extends down to the buried DUF collector.

Preferably the trench encloses the transistor region. The sidewalls of the trenches are coated with an oxide and then filled with polysilicon. By using only a thin oxide coating and polysilicon problems inherent with oxide trenches due to the difference in coefficient of expansion of the oxide and silicon are avoided. Channel stops of the second conductivity type are implanted below the trenches before filling with the undoped polysilicon. An oxide layer is grown over the epitaxial layer and then resistor and base regions implanted through the oxide and into the epitaxial region. The collector region is deeply implanted directly into the epitaxial region. The implant damage is annealed by heating the device. Doped polysilicon emitter and collector contacts are then formed. An emitter region is then formed in the base by heating the device so as to drive the impurity in the polysilicon into the base and collector regions. Metal contacts and interconnects are then formed.

Preferably, the first conductivity type impurity is N-type and the second is P-type. More specifically, the slow diffusing impurity is antimony while the fast diffusing one is phosphorus. By utilizing a thin oxide of between 1000 and 1500 Angstroms a low implant energy may be used for forming the base resulting in a minimum of straggle and a shallow base region. By using boron as an impurity and an implant energy of 60 keV or below a base depth of less than 5,000 Angstroms is achieved.

By using a high doping of base impurity it is possible to reduce the base resistance and reduce base delay. By achieving shallow junctions it is possible to narrow the epitaxial layer to 1.0 to 1.4 microns and thus reduce the collector resistance.

By forming trenches that are approximately 2 microns wide it is possible to integrate devices on a chip to approximately an order of magnitude more dense than can conventional bipolar devices.

Utilizing a deep collector implant avoids the long anneal time that is associated with a standard deep collector and the consequent disruption of the boron diffusion profile Choosing antimony as a dopant for the DUF region results in a minimizing of up-diffusion from the buried collector and therefore also assists in achieving a narrow epitaxial layer.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 23:
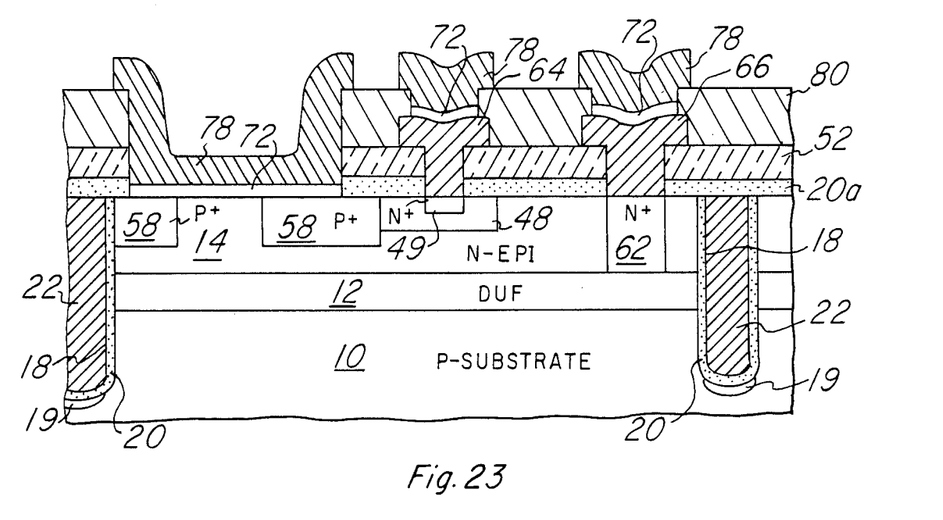
FIG. 23 is a sectional elevation view on one cell of the chip of FIGS. 1 to 21 with the last stage of manufacture utilizing a thick conformal deposit of silicon dioxide.
Figure 24:
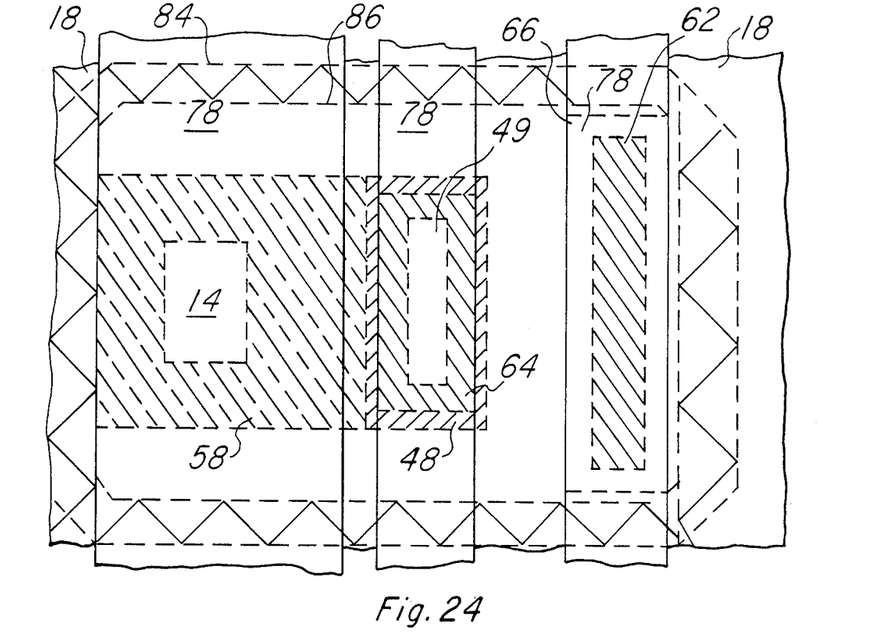
FIG. 24 and 25 are plan views of the cell shown in FIG. 23.

Referring to FIGS. 23 and 24 there is shown a bipolar transistor being one of many formed on each of a number of silicon bars. The bars are formed from a silicon slice. In accordance with a preferred embodiment of the present invention each transistor consists of a monocrystalline P-type silicon substrate 10 having an N-type antimony implanted DUF region 12 extending a thickness of 3 to 3.5 microns into the slice. An N-type epitaxial layer 14 is deposited over the DUF region 12 to a thickness of 1.0 to 1.4 microns. Polysilicon filled trenches 18 divide up the substrate 10 and epitaxial layer 14 into a number of regions in which bipolar transistors are formed. Each transistor consists of a heavily doped shallow base region 48 extending down only 3,000 to 4,000 Angstroms brought to a surface contact by a heavily doped P+ region 58 in the shape of a rectangular strip having a central rectangular volume of epitaxial region 14. A metal contact 78 contacts both the P+ region as well as the epitaxial region 14 to form a clamping Schottky diode between the P+ region 58 and the epitaxial region 14. Platinum silicide 72 is used between metal contacts 78 and silicon 14 and polysilicon emitter 64 and collector contacts 66 to enhance ohmic contact. An unclamped device would be identical to FIG. 23 except the P+ region 58 would extend completely under the base contact.

Figure 1:
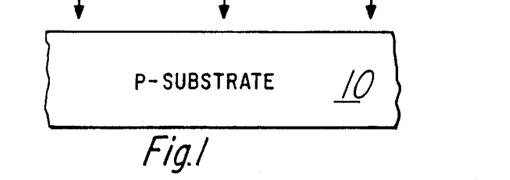
FIGS. 1 to 22 are greatly enlarged sectional elevation views of one cell of a semiconductor chip made in accordance with a preferred embodiment of the invention and showing the device at successive stages of manufacture.
Figure 2:
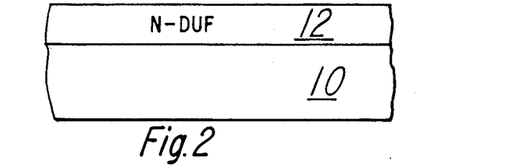
Figure 3:
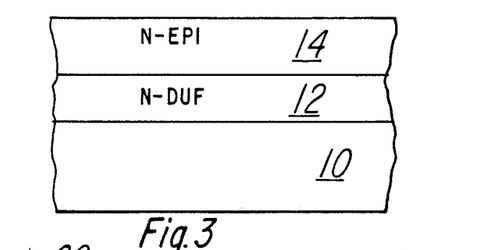

A shallow emitter 49 of about 1 000 to 2,000 Angstroms depth is formed in the base region 48 by diffusion from a phosphorous doped polysilicon emitter 64. A deep N+ collector contact 62 is formed in the epitaxial region 14 to make contact with the DUF region 12 which acts as a buried collector. Metal contacts 78 are formed over the surface and are insulated from the epitaxial region 14 by a thermally grown oxide 20a and overlying nitride layer 52 to reduce conductor capacitance. To further reduce capacitance a chemical vapor deposited oxide film 80 may optionally be incorporated. Such a film also provides planarization for the first level interconnect. Referring to FIGS. 1 and 2, there is shown a P-type silicon substrate 10 being subjected to a blanket implant of antimony to a post anneal depth of 3 to 3.5 microns and a final sheet resistance of 15–20 ohms per square. Since antimony diffuses much more slowly in silicon than do other types of donor impurities such as phosphorus or arsenic, up-diffusion into the overlying epitaxial layer will be significantly less. Next as seen in FIG. 3 an N-type epitaxial layer 14 is deposited over the antimony implanted DUF region 12 at reduced pressure to a thickness of 1.0 to 1.4 microns with a resistivity which depends upon circuit applications. This thickness of epitaxial layer 14 is about 20% less than the thicknesses of epitaxial layers used in conventional technologies and requires shallow emitter and base regions.

A layer of silicon dioxide 16 is then deposited to a thickness of about 1.0 to 1.5 microns. A layer of photoresist (not shown) is then deposited over the silicon dioxide exposed to ultra violet light through mask and the exposed portions removed in order to open a number of spaced apart trench regions. The trench regions 1 are then etched to form deep trenches extending below the DUF region 12 having a width of 1.5 to 2.0 microns by first depositing a layer of photoresist (not shown), patterning the latter and etching the deposited oxide and then the exposed silicon.

Figure 4:
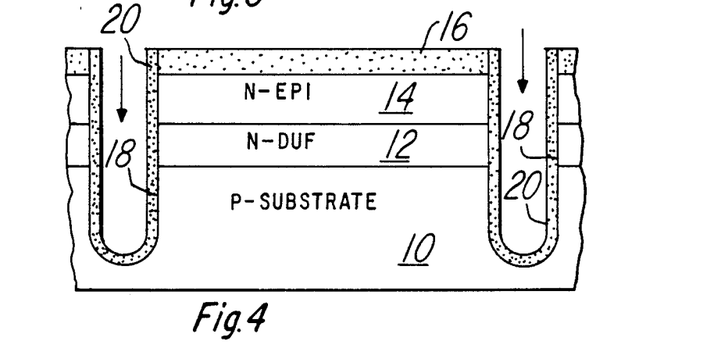
Figure 5:
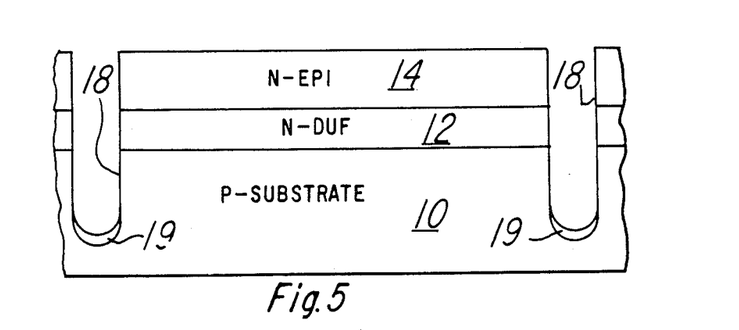
Figure 6:
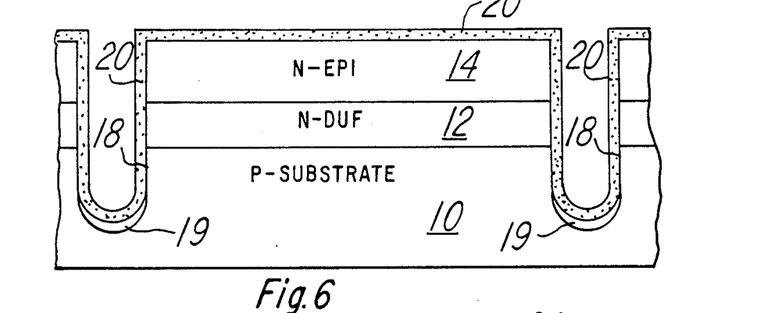

As shown in FIG. 4 a sidewall oxide 20 is grown over the walls of the trenches 18 by placing the cell in an atmosphere of steam at a temperature of approximately 1,000° C. for about 15 minutes. A channel stop boron implant is then directed into the trenches 18 at an energy of 40 to 60 keV and a concentration of about $1 \times 10^{14}$ atoms per square centimeter to form a P+ channel stop region 19 below each trench 18 in order to prevent an inversion layer from forming around the trench oxide sidewall 20. An etch removes the layer of silicon dioxide 16 on the surface of the N-epitaxial layer 14 and on the trench sidewalls as shown in FIG. 5. A new layer of sidewall oxide is grown as shown in FIG. 6.

Figure 7:
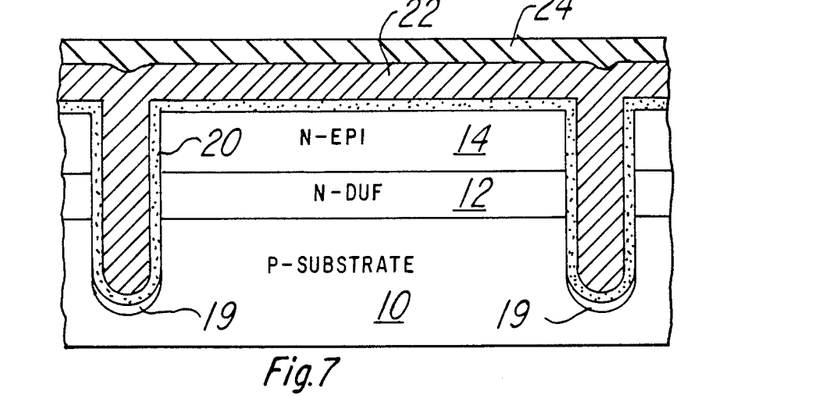
Figure 8:
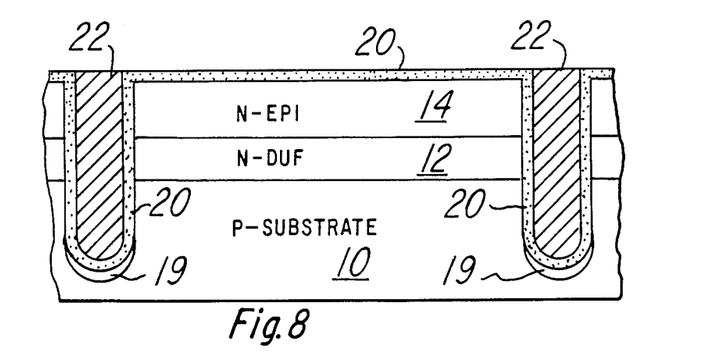

Next the trenches 18 are filled with a polysilicon deposit 22 as seen in FIG. 7 and onto the latter layer is deposited a layer of photoresist 24 which is flat. The photoresist 24 is selected to have an etch rate which is substantially the same as that of the underlying polysilicon. Thus, upon etching the photoresist and polysilicon down to the oxide surface a flat oxide surface 2 as seen in FIG. 8 is achieved. By using such trenches as isolation regions the oxide encroachment into the active device area present in devices using ordinary oxide isolation is avoided and the packing density can be increased significantly. In oxide isolation the current design rule requires a separation of 8–10 microns between transistors to achieve acceptable tank-to-tank breakdown voltages whereas with a polysilicon filled trench the 1.5–2 micron width of the trench is the limit in separation.

Figure 9:
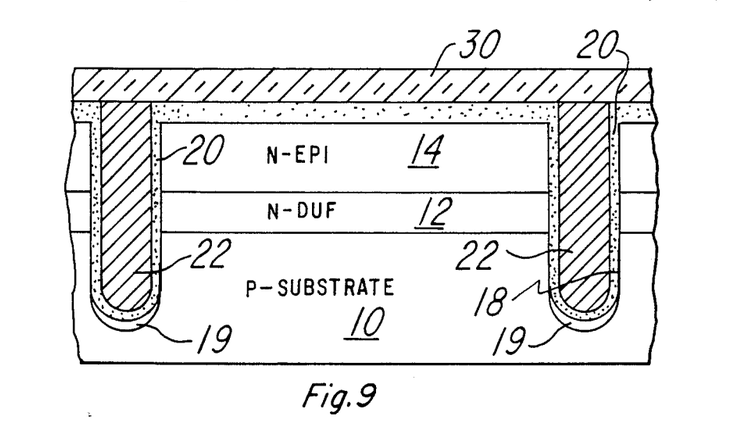
Figure 10:
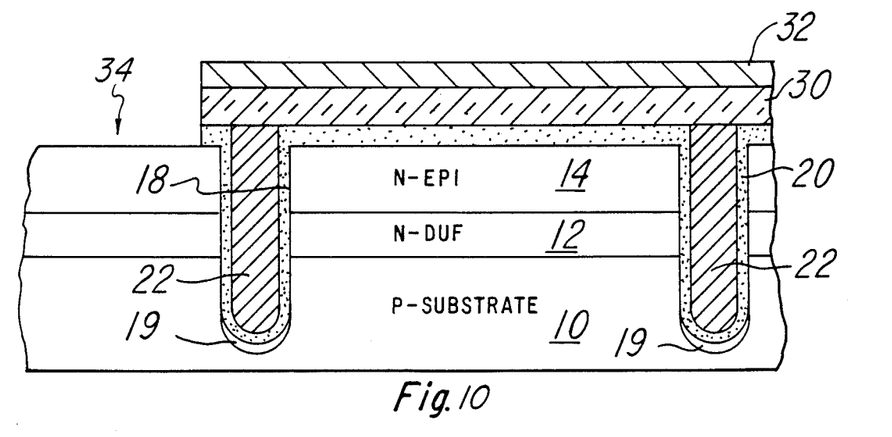
Figure 11:
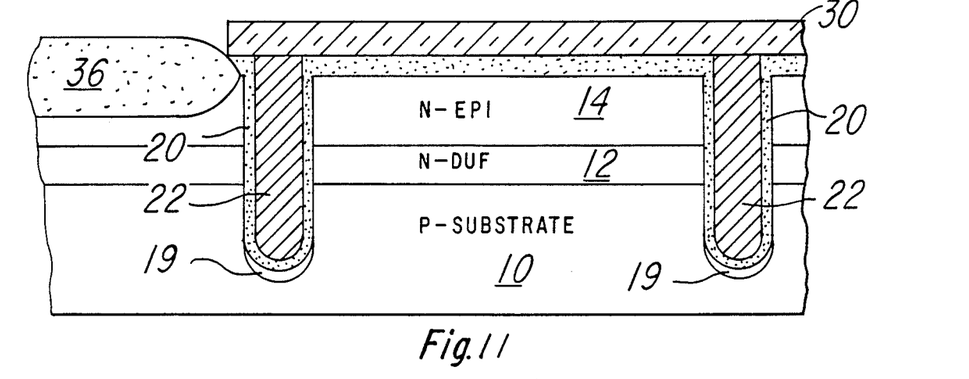

Referring to FIG. 9, a layer of silicon nitride 30 is formed over the oxide surface by a low pressure chemical vapor deposition. As seen in FIG. 10, a layer of photoresist 32 is deposited over the nitride 30 and then patterned, and the exposed isolation region 34 etched to remove the nitride 30 and oxide 20. The entire slice is then exposed to an oxidizing high pressure atmosphere at about 900° C. for about 2 hours. During oxidation silicon is consumed so that a relatively thick oxidation isolation region 36 is formed as seen in FIG. 11.

Figure 12:
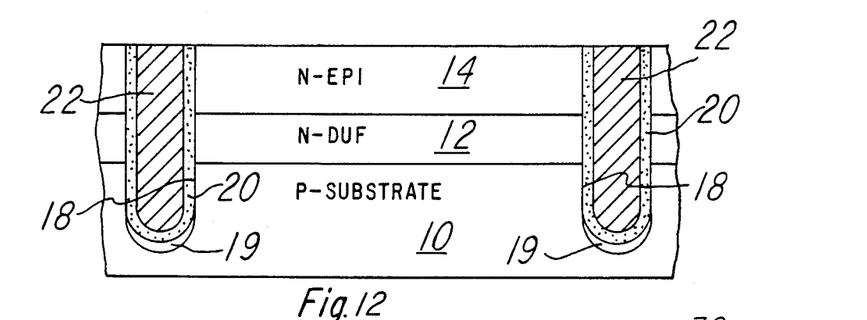
Figure 13:
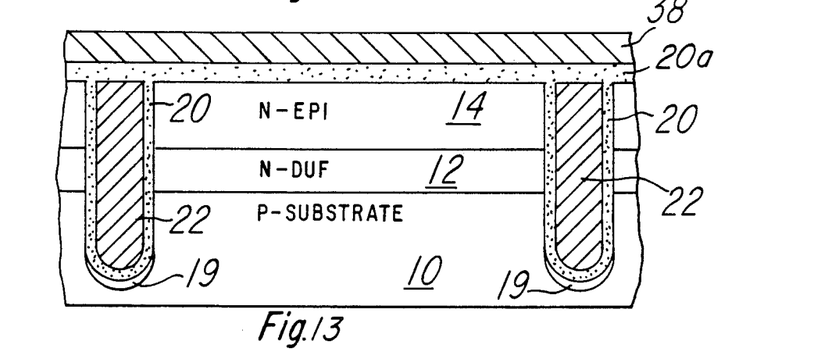
Figure 14:
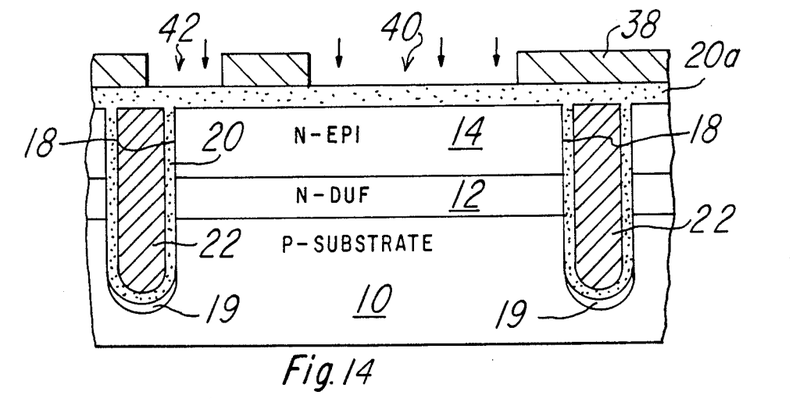
Figure 15:
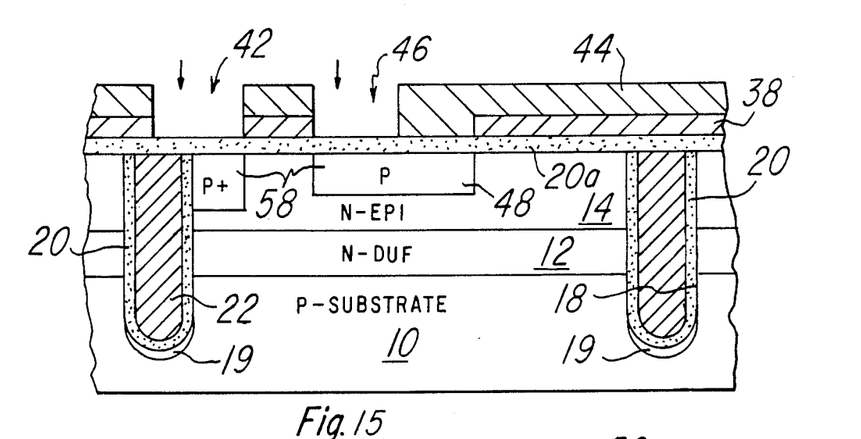
Figure 16:
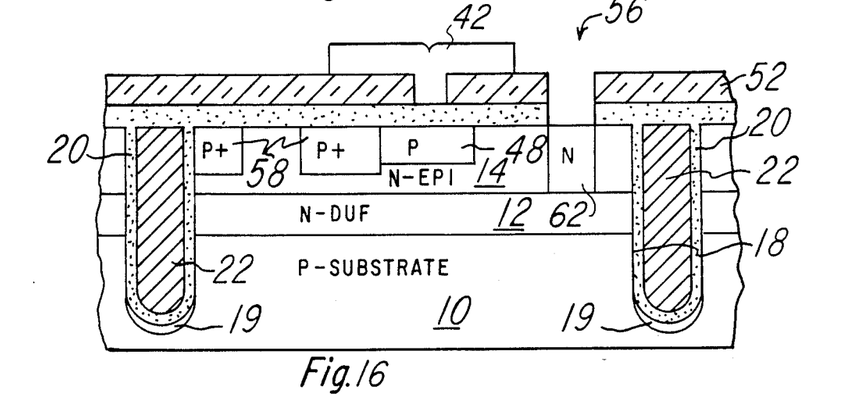

Next, as shown in FIG. 12 the nitride is etched off along with oxide layer 20. A higher integrity, more uniform oxide layer 20 is then thermally grown. As shown in FIG. 13 a layer of photoresist 38 is used to pattern openings for a resistor/base implant which is done at an energy of 40 to 60 keV at a concentration suitable to obtain the sheet resistance required by the device application. The resistor implant (not shown) is made in a different separate region bounded by a different pair of trenches. Conventional processing is used to form the elongated P type implanted resistor body and P+ implanted regions at either end thereof. The openings 40 and 42 are defined by the photoresist level 38 and shown in FIG. 14. A layer of photoresist is then deposited over the initial resist and exposed to light through a mask which allows the resist to cover the resistor body (not shown). After removing the exposed photoresist the surface is subjected to an intrinsic base boron implant. Once again a layer of photoresist 44 is applied and patterned to open regions 42 and 46 as seen in FIG. 15 by composing the geometries with photoresist level 38. An extrinsic base implant of boron results in P+ region 58 as seen in FIG. 16 which extends approximately 4,000 to 5,000 Angstroms below the silicon surface and has a sheet resistance of 80 to 100 ohms per square. The P-type region 48 resulting from the intrinsic implant extends about 3,000 to 4,000 Angstroms below the silicon surface. The base region 48 is heavily doped to the point where its sheet resistance is 600 to 800 ohms per square. This high level of base doping reduces base resistance and hence decreases gate delay and switching time. All of the above junction depths and sheet resistance values are final process values.

The photoresist 38, resistor block (not shown), and photoresist 44 is stripped and a low pressure chemical vapor deposition (LPCVD) is used to form a surface passivation layer of nitride 52 over the surface as shown in FIG. 16. The thermal oxide 20 and LPCVD nitride 52 serve to minimize the capacitance of the conductors to ground. Another layer of photoresist 54 is deposited over the nitride 52 and oxide 20a and patterned and etched to open region 56 for a collector and region 60 for the emitter. The photoresist 42 is used as an implant blocking layer over the emitter and is patterned by conventional means. A deep phosphorus implant at an energy of 100–120 keV is effected with a concentration in the range of $5\times10^{15}$ to $3\times10^{16}$ atoms per square centimeter.

Figure 17:
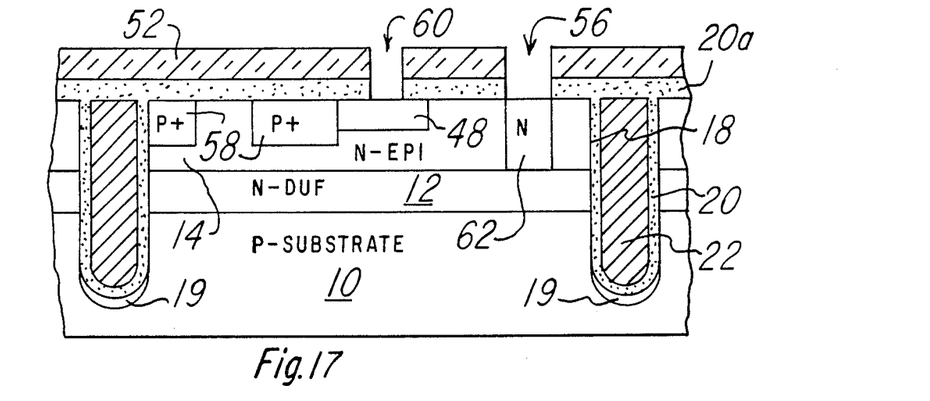
Figure 18:
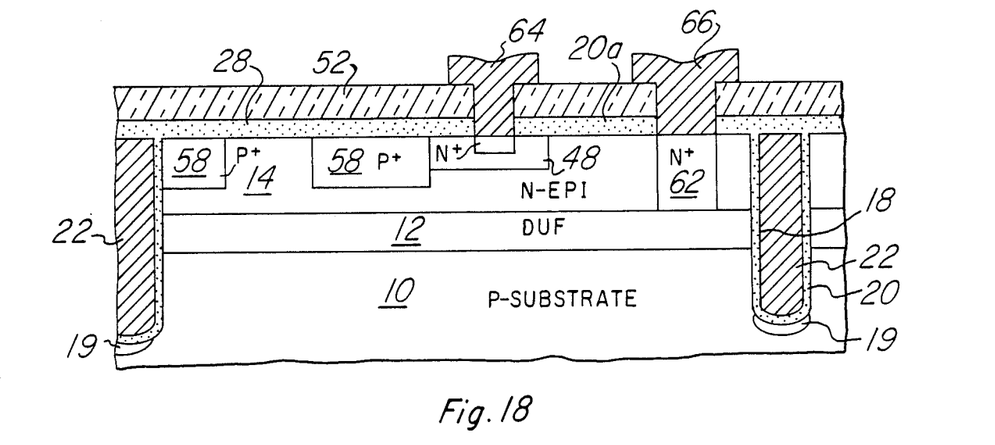

As shown in FIG. 17, photoresist layer 42 is removed to open the emitter contact region 60. A short base anneal is done to drive the collector and also to anneal implant damage. Polysilicon is then deposited in the holes 56 and 60 and over the nitride surface 52. A phosphorus implant is made to the polysilicon at an energy in the range of 80 to 100 keV and at a concentration in the range of $5\times10^{15}$ to $2\times10^{16}$ atoms per square centimeter. Then the polysilicon is patterned and etched to form the emitter 64 and collector contacts 66 as shown in FIG. 18. An emitter anneal at 900° C. is done in order to drive phosphorus down from the emitter polysilicon into emitter region 48. The latter anneal also drives phosphorous from the collector polysilicon 66 into the collector region 62. The use of a high efficiency polysilicon diffused emitter 64 is necessary in view of the highly doped shallow base region 48. In shallow emitter devices surface recombination at the metal contacting surface results in small current gain (large increases in base current while collector current remains flat for small changes in emitter junction depth). This small gain arises due to heavy recombination in the emitter contact area resulting from large variations in the crystal properties at the interface and an emitter junction depth shallower than the diffusion length of holes within the emitter. Polysilicon does not produce undesirable implant damage of the mono-silicon substrate since only the polysilicon is implanted and the latter then used as a diffusion source for the monocrystalline portion of the emitter. This leads to an almost ideal low current performance in forward injection while the phosphorus emitter profile leads to improved breakdown characteristics. Current gain is thus largely independent of current level in the normal operating range for bipolar transistors.

Figure 19:
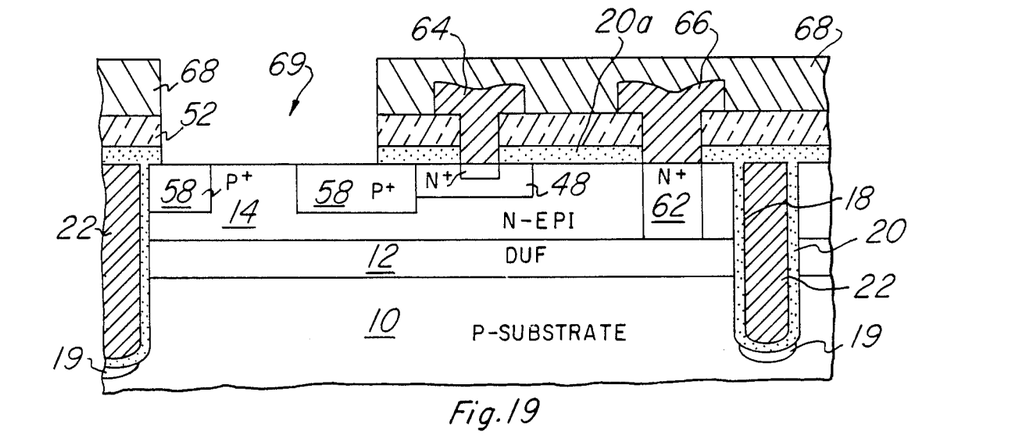
Figure 20:
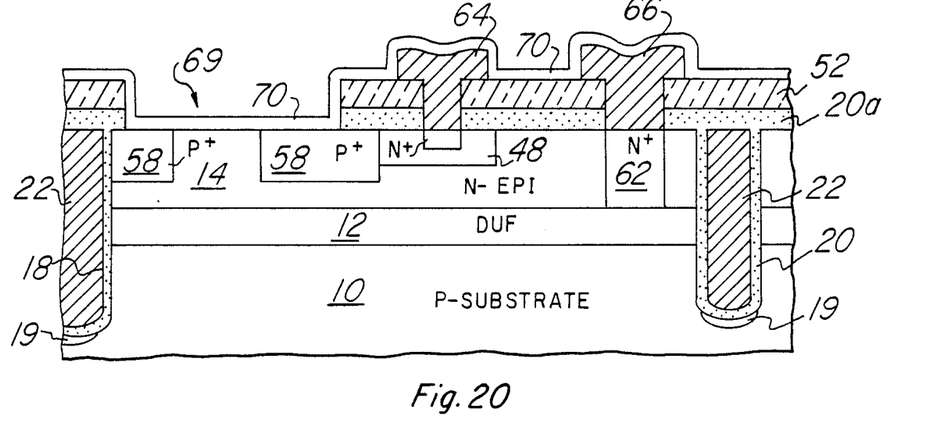
Figure 21:
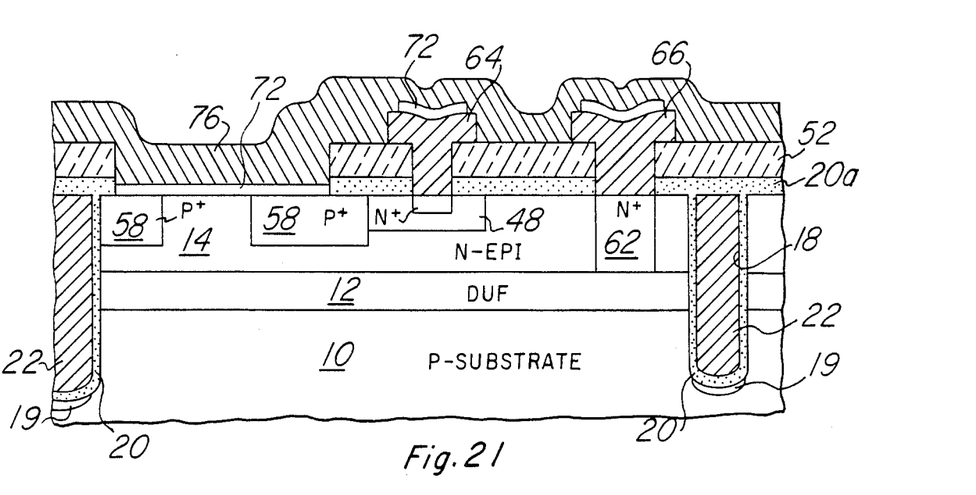
Figure 22:
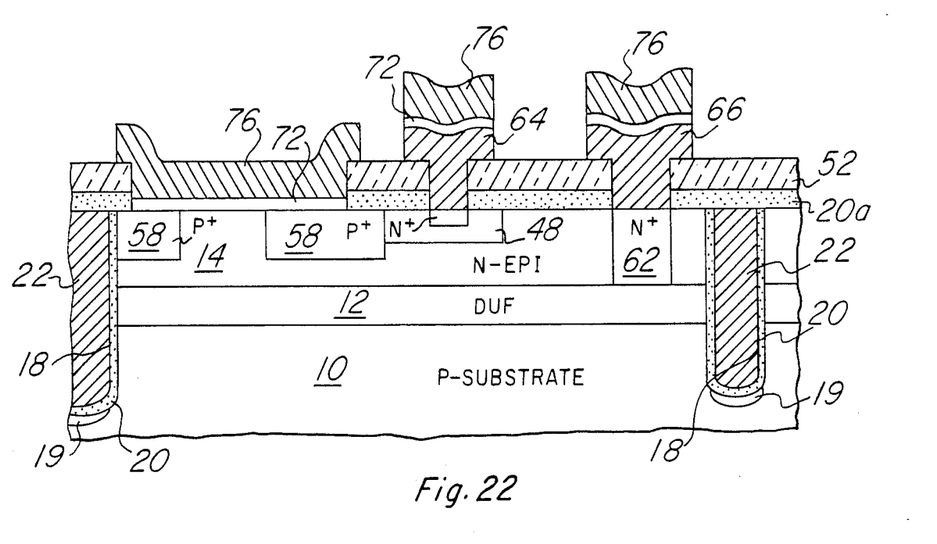

The formation of contacts and leads involves another deposit of photoresist 68 and patterning and etching to form an open region 69 as shown in FIG. 19. Next a platinum layer 70 is sputtered over the surface of the open region 69, polysilicon contacts 64 and 66 and the nitride layer 52. The platinum is sintered to form platinum silicide 72 wherever platinum and silicon are in contact as seen in FIGS. 20 and 21 and any unsintered platinum is removed. A layer of metal 76 is deposited over the surface and then patterned and etched using photoresist to leave the structure shown in FIG. 22. The platinum silicide lowers the ohmic contact resistance between the silicon and the corresponding metal contact. The remainder of the process involves standard metal fabrication.

Optionally as shown in FIG. 23, a thick 10,000 Angstrom conformal layer 80 of silicon dioxide may be deposited by low temperature chemical vapor deposition methods. The thickness of the layer 80 results in a relatively planar surface. The latter layer 80 of silicon dioxide is then etched back to about 2000 Angstroms by resist etch back techniques above the polysilicon making its top surface even more planar. Contacts to the emitter base and collector are opened and metal 78 deposited and patterned as shown. Improved registration alignment required for the initial metal level is achieved as well as decreased interconnect capacitance, increased reliability and planarization.

Figure 25:
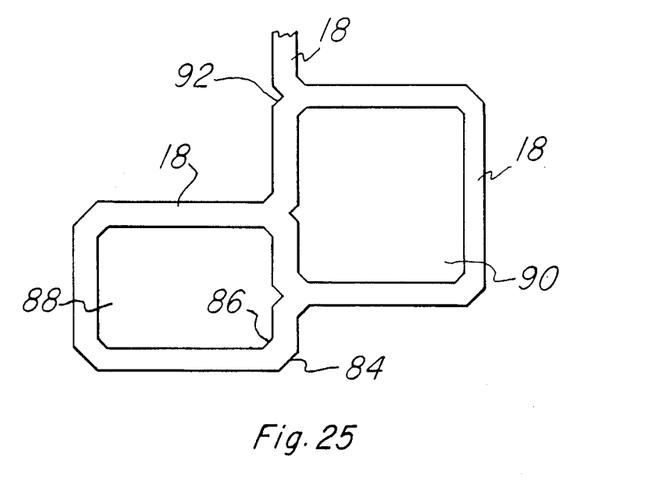

The trench structure as seen in the top view of FIG. 24 is angled at 45° to each side both on the outside 84 and inside 86 walls so as to maintain a constant width at the corners and avoid voiding in the polysilicon used to fill the trench. In the event two bipolar transistors 88 and 90 are placed adjacent to one another as in FIG. 25, a notch 92 is patterned into the trench 18.

The use of shallow junctions allows a thin epitaxial layer to be used without increasing collector base capacitance significantly. A thin epitaxial deposit reduces the collector resistance as well as the charge storage under the active base. The us of a deep collector implant followed by a short base anneal provides a method of reducing the collector resistance to an extent possible by the conventional means of phosphorus-oxy chloride diffusion but providing better control over diffusion profiles. The use of antimony which diffuses much more slowly in silicon than do other impurities such as phosphorus limits the amount of up-diffusion of the buried collector or DUF region 14 and therefore allows a thinner epitaxial layer 12. In conventional oxide isolation the current design rule is 8 microns due to breakdown voltage requirements. In the present invention the use of narrow 2 micron wide trenches filled with polysilicon allows a substantially greater packing density by nearly an order of magnitude than would be possible with conventional oxide isolation.

By utilization of a high efficiency polysilicon diffused emitter, an increase in active basedoping is possible. A heavily doped base, in turn, means a lower base resistance and hence a lower gate delay (or switching time).

As a result of packing density improvements there has been a reduced metal to metal spacing and a consequent increased capacitance due to fringe capacitance between the edges of the conductor and the under lying ground plane and coupling between adjacent lines. The use of a low temperature oxide non-conducting undoped low dielectric constant oxide in combination with a layer of silicon nitride between metal and ground minimizes such capacitance.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A bipolar transistor cell formed on a semiconductor substrate of a second conductivity type, comprising:
   a buried DUF collector region of a first conductivity type in said substrate,
   an epitaxial layer of a first conductivity type overlying said DUF collector region;
   isolation means enclosing a transistor region including a trench at least partially enclosing said transistor region and extending through said epitaxial layer and said DUF collector region;
   said transistor region including emitter and base regions doped with impurities of the first and second conductivity types, respectively, in said epitaxial layer;

a collector contact region of the first conductivity type in said transistor region extending through the epitaxial layer to said buried DUF collector region;

a layer of silicon oxide overlying said epitaxial layer and a separate surface passivation layer overlying said silicon oxide layer;

polysilicon contacts to said emitter and collector contact regions extending through said silicon oxide and passivation layers and having expanded area contact portions extending over respective limited areas of said surface passivation layers, said polysilicon contacts doped with the same impurity as said emitter region;

a separate further, thicker layer of silicon oxide overlying said surface passivation layer and having a substantially planarized surface; and metal conductors extending over said planarized surface and through part only of the thickness of the thicker layer of silicon oxide to make contact with said expanded area contact portions of said polysilicon contacts.

2. A transistor cell according to claim 1, wherein said buried DUF is an antimony doped region.

3. A transistor cell according to claim 1, wherein said DUF collector region is in the range of 3 to 3½ microns thick, is antimony doped to provide a sheet resistance in the range of 15 to 25 ohms per square, and said epitaxial layer is in the range of 1.0 to 1.4 microns thick.

4. A transistor cell according to claim 1, wherein said base region includes an intrinsic base region having a thickness in the range of approximately 3,000 to 4,000 Angstroms and a sheet resistance of less than approximately 1,000 ohms per square, and an extrinsic base region having a thickness in the range of approximately 4,000 to 5,000 Angstroms.

5. A transistor cell according to claim 4, wherein said intrinsic base region is boron doped.

6. A transistor cell according to claim 1, where in said first conductivity type is N-type and said second conductivity type impurity is P-type.

7. A transistor cell according to claim 1, wherein said trench encloses said transistor region.

8. A transistor cell according to claim 7, wherein said sidewalls and a bottom of said trench have a thin oxide coating.

9. A transistor cell according to claim 7, wherein the width of said trench is in the range of 1.5 to 2.0 microns wide.

10. A transistor cell according to claim 7, wherein said trench is filled with polysilicon.

11. A transistor cell according to claim 8, wherein said trench is filled with polysilicon.

12. A transistor cell according to claim 1, wherein said trench, viewed in plan, has corners which are bevelled so as to provide a substantially uniform trench width.

13. A transistor formed at a face of a semiconductor body and at least partly enclosed by an isolating trench which, viewed in plane, has corners that are bevelled so that the trench has a substantially constant width.

14. A transistor according to claim 13, wherein the trench is a bevelled corner rectangle, viewed in plan.

15. A transistor according to claim 13, wherein the trench contains a polysilicon filler.

16. A transistor according to claim 15, wherein the trench has a thin insulating layer coating its sidewalls.

17. A transistor according to claim 16, wherein the insulating coating comprises silicon oxide.

18. A transistor according to claim 13, wherein said face of the semiconductor body is provided by an epitaxial layer on semiconductor substrate, and the trench extends beyond the epitaxial layer into the substrate.

19. A transistor according to claim 14, wherein said face of the semiconductor body is provided by an epitaxial layer overlying a subsurface collector region in said semiconductor body, said epitaxial layer accommodating either and base regions of said transistor, and wherein said trench extends through said epitaxial layer and said subsurface collector region.

20. A bipolar transistor cell formed at a face of a semiconductor body, comprising:

an n type impurity doped epitaxial layer defining said face of the semiconductor body and overlying a buried, antimony doped, n+ type collector region in said semiconductor body;

a p type impurity doped intrinsic base region in said epitaxial layer over said buried collector region;

an n+ type impurity doped emitter region in said intrinsic base region;

an n+ type impurity doped, collector contact region extending through said epitaxial layer to said buried collector region;

an isolation region comprising polysilicon extending into said semiconductor body through the epitaxial layer and said buried collector region, and at least partly surrounding said transistor cell;

a layer of silicon oxide overlying said epitaxial layer and a silicon nitride surface passivation layer overlying said silicon oxide layer;

polysilicon contacts to said emitter and collector contact regions extending through said silicon oxide and passivation layers and having expanded area contact portions extending over respective limited areas of said surface passivation layer, said polysilicon contacts doped with the same impurity as said emitter region;

a further layer of silicon oxide overlying said surface; passivation layer and having a substantially planarized surface;

and metal conductors extending over said planarized surface and through part only of the thickness of the further layer of silicon oxide to make contact with said expanded area contact portions of said polysilicon contacts.

21. A transistor cell according to claim 20, wherein said buried collector region is about 3.0 to 3.5 microns thick and said epitaxial layer is about 1 to 1.4 microns thick.

22. A transistor cell according to claim 20, including a p+ type extrinsic base region contiguous with said intrinsic base region and extending more deeply into said epitaxial layer than said intrinsic base region.

23. A transistor cell according to claim 20, wherein said isolation region comprises a polysilicon region surrounded by a silicon oxide coating.

24. A transistor cell according to claim 23, including a channel stop region between said polysilicon region and the underlying semiconductor body.

25. A transistor cell according to claim 20, wherein said isolation region comprises a polysilicon region surrounded by a silicon oxide coating; said buried collector region is about 3.0 to 3.5 microns thick and said epitaxial layer is about 1.0 to 1.4 microns thick; and including a p+ type extrinsic base region contiguous with the intrinsic base region and extending more deeply into the epitaxial layer than the intrinsic base region.

26. A transistor cell according to claim 25, wherein the extrinsic base region has a thickness of about 4,000 to 4,500 Angstroms and the intrinsic base region has a thickness of about 3,000 to 4,000 Angstroms.

* * * * *

UNITED STATES PATENT AND TRADEMARK OFFICE
CERTIFICATE OF CORRECTION

PATENT NO. : 4,868,631

DATED : Sep. 19, 1989

INVENTOR(S) : Deems R. Hollingsworth    Harry F. Pang
Steve Thompson    Douglas P. Verret It is certified that error appears in the above-indentified patent and that said Letters Patent is hereby corrected as shown below:

On the title page, item [75] add:

— Douglas P. Verret, Sugarland, —
after "Harry F. Pang, Houston," as a fourth joint inventor.

Signed and Sealed this

Twenty-fifth Day of March, 1997

*Attest:*

BRUCE LEHMAN

*Attesting Officer*     Commissioner of Patents and Trademarks